(12) United States Patent
Saito et al.

(10) Patent No.: US 7,173,361 B2
(45) Date of Patent: Feb. 6, 2007

(54) FILM BULK ACOUSTIC WAVE RESONATOR

(75) Inventors: Hisatoshi Saito, Tokyo (JP); Takao Noguchi, Tokyo (JP); Kenji Inoue, Tokyo (JP)

(73) Assignee: TDK Corporation (JP)

( * ) Notice: Subject to any disclaimer, the term of this patent is extended or adjusted under 35 U.S.C. 154(b) by 76 days.

(21) Appl. No.: 11/028,992

(22) Filed: Jan. 3, 2005

(65) Prior Publication Data

US 2005/0189846 A1    Sep. 1, 2005

(30) Foreign Application Priority Data

Jan. 7, 2004  (JP) ............................. 2004-001535

(51) Int. Cl.
*H01L 41/08* (2006.01)
*H03H 9/54* (2006.01)

(52) U.S. Cl. ...................... 310/320; 333/187

(58) Field of Classification Search ............... 310/334, 310/311, 335, 313 D, 313 R, 322, 326, 320; 333/187, 189
See application file for complete search history.

(56) References Cited

U.S. PATENT DOCUMENTS 6,995,497 B2 *  2/2006  Inoue ..................... 310/320
2005/0093157 A1 *  5/2005  Noguchi et al. ............ 257/753
2006/0119230 A1 *  6/2006  Umeda et al. .............. 310/358
2006/0145785 A1 *  7/2006  Ishii et al. .................. 333/187

FOREIGN PATENT DOCUMENTS

JP        10-270979        9/1998
WO      WO03017481      * 2/2003

* cited by examiner

Primary Examiner—Thomas M. Dougherty
(74) Attorney, Agent, or Firm—Young Law Firm, P.C.

(57) ABSTRACT

A film bulk acoustic wave resonator of the invention includes a substrate; a resonant structure provided on the substrate constituted by a lower electrode, a piezoelectric film and an upper electrode; and an acoustic multilayer of a plurality of reflective films provided between the substrate and the resonant structure. At least one of the reflective films of the acoustic multilayer has a specified crystal plane orientation, and an X-ray rocking curve full width at half maximum that is preferably not greater than 10 degrees, and more preferably is not greater than 3 degrees. This makes it possible to obtain better resonance characteristics than in the case of the prior art, by increasing the efficiency with which bulk waves propagating towards the substrate are reflected.

12 Claims, 5 Drawing Sheets

FILM BULK ACOUSTIC WAVE RESONATOR

TECHNICAL FIELD

The present invention relates to a film bulk acoustic wave resonator, and particularly to a solidly mounted resonator (SMR) type film bulk acoustic wave resonator having an acoustic multilayer.

BACKGROUND OF THE INVENTION

In recent years, various resonators using piezoelectric materials such as a film bulk acoustic wave resonator (FBAR) and a surface acoustic wave (SAW) resonator have come into practical use as small and high-performance resonators. Especially, the film bulk acoustic wave resonator has been recently attracting attention in view of uses where a high resonant frequency such as GHz band is required, because the resonant frequency thereof is easily increased due to its structure compared to the surface acoustic wave resonator.

As described in Japanese Patent Application Laid Open No. 10-270979, the film bulk acoustic wave resonator is basically constituted of an upper electrode, a lower electrode and a piezoelectric film interposed therebetween. A certain resonance characteristics can be obtained by applying a high frequency signal between the upper electrode and the lower electrode. The resonant frequency of the film bulk acoustic wave resonator mainly depends on film thicknesses of the upper electrode, the lower electrode and the piezoelectric film.

Film bulk acoustic wave resonators include the diaphragm type and the SMR type. In structure, a diaphragm type film bulk acoustic wave resonator has a substrate cavity below a resonant structure comprised of an upper electrode, a lower electrode and a piezoelectric film, with both sides (the upper electrode side and the lower electrode side) of the resonant structure being open to the air.

In contrast, in place of a substrate cavity, an SMR type film bulk acoustic wave resonator has an acoustic multilayer between the substrate and resonant structure comprised of a plurality of reflective films. The acoustic multilayer reduces undesired bulk wave reflections from the substrate. Because it does not require the formation of a substrate cavity, an SMR type film bulk acoustic wave resonator is relatively easy to fabricate, making it suitable for mass production, and also provides high reliability, since the mechanical strength is not reduced by the existence of a cavity.

However, SMR type film bulk acoustic wave resonators are known to be generally inferior to the diaphragm type concerning resonance characteristics. This is because the air interface on both sides of the resonant structure in the case of the diaphragm type enables relatively free resonance, while in the case of the SMR type, bulk waves propagated on the substrate side that are not adequately reflected by the acoustic multilayer reach the substrate and are reflected thereby, giving rise to spurious bulk waves.

SUMMARY OF THE INVENTION

It is therefore an object of the present invention to provide an SMR type film bulk acoustic wave resonator having an improved acoustic multilayer that improves the resonance characteristics.

Generally, an acoustic multilayer consists of a plurality of pairs of reflective films having different acoustic impedances, with the difference in the acoustic impedance being utilized to reflect bulk waves propagating to the substrate side. Therefore, when selecting the material of the reflective films constituting the acoustic multilayer, it is necessary to take the acoustic impedance of the material into consideration. Research by the present inventors revealed that the reflection efficiency of the acoustic multilayer is considerably affected not only by the acoustic impedance difference but also by the orientation of the reflective films of the acoustic multilayer. Moreover, further research by the inventors also showed that the impedance ratio (the ratio of the resonance impedance and the antiresonance impedance) is also affected by the orientation of the reflective films.

The present invention was based on these technical findings. The film bulk acoustic wave resonator according to the invention comprises a substrate, a resonant structure provided on the substrate, and an acoustic multilayer constituted by a plurality of reflective films disposed between the substrate and the resonant structure, in which at least one of the reflective films of the acoustic multilayer has a specified crystal plane orientation.

Thus providing at least one of the reflective films of the acoustic multilayer with a specified crystal plane orientation makes it possible to increase the efficiency with which bulk waves propagating towards the substrate are reflected, thereby making it possible to reduce undesired reflections from the substrate compared to the prior art. As a result, compared to the prior art, better resonance characteristics can be obtained.

The X-ray rocking curve full width at half maximum (FWHM) of the at least one reflective film is preferably not greater than 10 degrees, and more preferably is not greater than 3 degrees. This is because the higher the crystallinity of the reflective film, the higher the bulk wave reflection efficiency and the impedance ratio become.

Preferably, the acoustic multilayer includes at least one pair of reflective films comprised of a first reflective film, and a second reflective film composed of a different material to that of the first reflective film. It is also preferable for the acoustic multilayer to include a plurality of pairs of first and second reflective films in which the X-ray rocking curve FWHM of at least one of the first and second reflective films of each pair is not greater than 10 degrees, and more preferably is not greater than 3 degrees.

When the reflective film having the specified crystal plane orientation has a cubic crystal structure such as aluminum nitride (AlN), zinc oxide (ZnO) and aluminum oxide ($Al_2O_3$), it is preferable for the specified crystal plane to be a (0001) plane. When the reflective film having the specified crystal plane orientation has a face-centered cubic crystal structure such as tungsten (W) and molybdenum (Mo), it is preferable for the specified crystal plane to be the (110) plane. This is because materials having a cubic crystal structure are readily oriented in the (0001) plane, and materials having a face-centered cubic structure are readily oriented in the (110) plane.

The resonant structure preferably includes a piezoelectric film provided between the upper and lower electrodes, and preferably further includes an adhesion orientation control film provided between the acoustic multilayer and the lower electrode. When the adhesion orientation control film is provided as the base of the lower electrode, it increases the adhesion between the lower electrode and the acoustic multilayer and elevates the crystallinity of the lower electrode.

Thus, in accordance with this invention, undesired reflections from the substrate are reduced, making it possible to provide a film bulk acoustic wave resonator having good resonance characteristics with low spuriosity, and it is also possible to achieve a high impedance ratio.

BRIEF DESCRIPTION OF THE DRAWINGS

The above and other objects, features and advantages of this invention will become more apparent by reference to the following detailed description of the invention taken in conjunction with the accompanying drawings.

DETAILED DESCRIPTION OF THE EMBODIMENTS

Preferred embodiments of the present invention will now be explained in detail with reference to the drawings.

Figure 1:
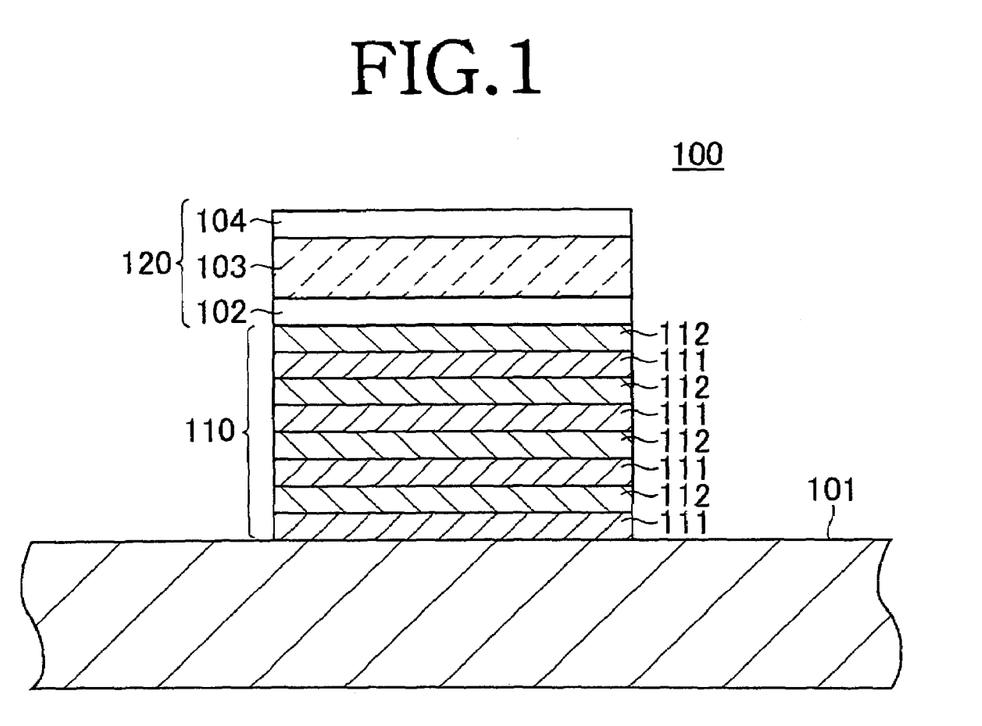
FIG. 1 is a schematic sectional view showing a structure of a film bulk acoustic wave resonator according to a preferred embodiment of the present invention.

FIG. 1 is a schematic sectional view showing a structure of a film bulk acoustic wave resonator according to a preferred embodiment of the present invention.

As shown in FIG. 1, the film bulk acoustic wave resonator 100 according to this embodiment is constituted of a substrate 101; a resonant structure 120 provided on the substrate 101 including a lower electrode 102, a piezoelectric film 103 and an upper electrode 104; and an acoustic multilayer 110 provided between the substrate 101 and the resonant structure 120. A certain resonance characteristics can be obtained by applying a high frequency signal between the lower electrode 102 and the upper electrode 104.

The substrate 101 serves as a substrate for securing mechanical strength of the film bulk acoustic wave resonator. A single crystal substrate of silicon (Si), sapphire or the like, a ceramic substrate of alumina, AlTiC or the like, or a quartz or glass substrate can be used as a material for the substrate 101. The most preferable material for the substrate 101 is Si single crystal, which is advantageous from the points of low cost and the availability of sophisticated wafer processes.

The acoustic multilayer 110 is constituted of alternately stacked first and second reflective films 111 and 112 formed of mutually different materials. This structure serves to enhance the characteristics of the film bulk acoustic wave resonator 100 by reflecting bulk waves propagating towards the substrate 101. There is no particular limitation on the number of reflective films used to compose the acoustic multilayer 110. In this embodiment, the acoustic multilayer is a stack of four pairs of the first reflective film 111 and the second reflective film 112. There is also no particular limitation on the material of the first and second reflective films 111 and 112, which may be a material having a cubic crystal structure such as, for example, aluminum nitride (AlN), zinc oxide (ZnO) and aluminum oxide ($Al_2O_3$) or a material having a face-centered cubic structure such as, for example, tungsten (W) and molybdenum (Mo). It is also possible to use a material such as silicon oxide ($SiO_2$) that is difficult to crystallize. For the first reflective film 111, which is located on the substrate 101 side, a material has to be selected that has a higher acoustic impedance than that of the second reflective film 112 located on resonant structure 120 side. So for example, the first reflective film 111 can be formed of aluminum nitride (AlN) and the second reflective film 112 of silicon oxide ($SiO_2$).

At least one of the reflective films of which the acoustic multilayer 110 is composed has a specified crystal plane orientation. Herein, this refers to a state in which reflection by the specified crystal plane can be confirmed when the X-ray rocking curve is measured. Preferably, the X-ray rocking curve FWHM thereof is not greater than 10 degrees, and more preferably is not greater than 3 degrees. This is because when the reflective films of the acoustic multilayer 110 are oriented in the specified crystal plane, the efficiency with which bulk waves propagating towards the substrate are reflected is improved, reducing undesired reflections from the substrate. The reflection efficiency is further improved when the X-ray rocking curve FWHM is not greater than 10 degrees, and when the X-ray rocking curve FWHM is not greater than 3 degrees, the reflection efficiency is even further improved, and the impedance ratio (the ratio of the resonance impedance and the antiresonance impedance) is also improved.

Although it is most preferable for all of the reflective films of the acoustic multilayer 110 to be oriented in the specified crystal plane, the invention is not limited to this, requiring only that at least one of the reflective films of the acoustic multilayer 110 be oriented in the specified crystal plane. It is also preferable for either all of the first reflective films 111 or all of the second reflective films 112 to be oriented in the specified crystal plane. For example, when the first reflective films 111 on the substrate 101 side are formed of aluminum nitride (AlN), it is preferable that all four of the first reflective films 111 be oriented in the specified crystal plane and have an X-ray rocking curve FWHM that is not greater than 10 degrees, and more preferably not greater than 3 degrees.

There is no particular limitation on the crystal plane orientation, but to facilitate fabrication, it is preferable to select an orientation that is readily achievable in the case of the material used. For example, a material having a cubic crystal structure such as aluminum nitride (AlN), zinc oxide (ZnO) or aluminum oxide ($Al_2O_3$) is readily oriented in the (0001) plane, so when such a material is used for the reflective films 111 and 112, the specified crystal plane should be the (0001) plane. Similarly, a material having a face-centered cubic structure such as, for example, tungsten (W) or molybdenum (Mo), is readily oriented in the (110) plane, so when such a material is used for the reflective films 111 and 112, the specified crystal plane should be the (110) plane. Both of these materials can be readily grown to form films and can readily be oriented in the specified crystal plane, and are therefore well suited as materials for the reflective films 111 and 112.

A material which is inherently difficult to crystallize, such as silicon oxide ($SiO_2$), can be used for just the first reflective film 111 or just the second reflective film 112, since using it for both would make it impossible to orient, in the specified crystal plane, all of the reflective films making up the acoustic multilayer 110.

There is no particular limitation on the method of forming the reflective films 111 and 112, which may be formed by vacuum deposition, sputtering, CVD and so forth. However, the film forming method and conditions have a major effect on the crystallinity of the reflective films, so it is necessary to make a suitable selection of the film forming method and conditions in order to control the crystallinity of the reflective films. When, for example, the material of the reflective films 111 or 112 is aluminum nitride (AlN) or zinc oxide (ZnO), the forming of a film having high crystallinity is facilitated by using RF magnetron sputtering as the film forming method.

The thickness of the reflective films 111 and 112 can be set according to the desired resonant frequency, and is preferably set to be about one-quarter the wavelength.

As described above, the wavelength is defined as the ratio between bulk wave acoustic velocity and desired resonant frequency (acoustic. velocity/resonant frequency).

The lower electrode 102 is used as one of the electrodes of the film bulk acoustic wave resonator and as a film underlying the piezoelectric film 103 during manufacturing. When a piezoelectric material of wurtzite crystal structure such as aluminum nitride (AlN), zinc oxide (ZnO) or gallium nitride (GaN) is used as the material of the piezoelectric film 103, the lower electrode 102 is preferably a metallic film uniaxially oriented in the (111) plane of a face-centered cubic structure or the (0001) plane of a hexagonal close-packed structure. When a metallic film that is uniaxially oriented in the (111) plane of a face-centered cubic structure or a metallic film that is uniaxially oriented in the (0001) plane of a close-packed hexagonal structure is used as the lower electrode 102, crystallinity of the piezoelectric material formed on the lower electrode 102 becomes extremely good through epitaxial growth.

The material of the lower electrode 102 preferably contains as its main component at least one of aluminum (Al), platinum (Pt), gold (Au), iridium (Ir), osmium (Os), rhenium (Re), palladium (Pd), rhodium (Rh) and ruthenium (Ru). Aluminum (Al), platinum (Pt), gold (Au), iridium (Ir), palladium (Pd) and rhodium (Rh) assume a face-centered cubic structure and osmium (Os), rhenium (Re) and ruthenium (Ru) assume a hexagonal close-packed structure. The surfaces of these metals are easy to keep clean and when fouled can be readily cleaned by ashing or heat treatment. A clean surface of the lower electrode 102 facilitates the formation of the piezoelectric film 103 with good crystallinity.

The lower electrode 102 is not limited to the foregoing metals, however, and can instead be formed of, for example, a film of body-centered cubic structure metal such as molybdenum (Mo) or tungsten (W) or a film of a perovskite structure oxide conductor such $SrRuO_3$.

The thickness of the lower electrode 102 may be set in accordance with the desired resonant frequency, and preferably set at approximately 1/10 of the wavelength. The lower electrode 102 is preferably formed by vacuum deposition, sputtering or CVD.

The piezoelectric film 103 serves to convert an electric signal applied between the lower electrode 102 and the upper electrode 104 into a bulk acoustic wave. As explained earlier, the piezoelectric material having the wurtzite crystal structure such as aluminum nitride (AlN) zinc oxide (ZnO), gallium nitride (GaN) or the like can be used as a material for the piezoelectric film 103. Although there is no particular limitation, the X-ray rocking curve full width at half maximum (FWHM) of the piezoelectric film 103 is preferably not greater than 10 degrees, and more preferably is not greater than 3 degrees, in order to obtain a good resonance characteristics.

When the piezoelectric film 103 is made of a piezoelectric material of wurtzite crystal structure such as AlN or ZnO, it is preferably formed by a sputtering method such as RF magnetron sputtering, DC sputtering or ECR sputtering, or by CVD (chemical vapor deposition), MBE (molecular beam epitaxy) or vacuum deposition. Among these, it is preferable to use a sputtering method, particularly the RF magnetron sputtering method. This is because RF magnetron sputtering enables ready formation of an AlN or ZnO film of high crystallinity with single c-axis orientation. When AlN is used, it is preferable to adopt reactive RF magnetron sputtering. In this case, an excellent AlN film can be formed by using Al metal for the cathode, introducing Ar and nitrogen gas, and conducting the reactive RF magnetron sputtering at a substrate temperature of around 200° C. A film excellent in crystallinity containing very little impurity can also be fabricated when ECR sputtering is used.

When the piezoelectric film 103 is made of a ferroelectric material such as PZT, it is preferably formed by vacuum deposition, sputtering, CVD or laser ablation. Vacuum deposition and sputtering are particularly preferable. The vapor deposition method known as reactive vapor deposition is particularly advantageous in enabling fabrication of a ferromagnetic film of high crystallinity and uniform thickness.

The thickness of the piezoelectric film 103 may be set in accordance with the desired resonant frequency, and preferably set at approximately half of the wavelength.

The upper electrode 104 is used as the other electrode of the film bulk acoustic wave resonator, and the material therefor is not particularly limited as long as the material has high conductivity. The upper electrode 104 can be formed of a metal such as aluminum (Al), gold (Au), platinum (Pt), tungsten (W) or molybdenum (Mo), an alloy of these metals and copper (Cu), or the like, or a multilayer film obtained by stacking layers of these metals and titanium (Ti) or the like. The thickness of the upper electrode 104 may be set in accordance with the desired resonant frequency, and preferably set at approximately one-tenth of the wavelength. Vacuum deposition, sputtering or CVD can be used to form the upper electrode 104.

The above is the structure of the film bulk acoustic wave resonator 100 of this embodiment. Thus providing at least one of the reflective films of the acoustic multilayer 110 with a specified crystal plane orientation makes it possible to increase the efficiency with which bulk waves propagating towards the substrate 101 are reflected, thereby making it possible to reduce undesired reflections from the substrate 101 compared to the prior art. As a result, better resonance characteristics can be obtained than in the prior art.

Next, another preferred embodiment of the present invention will now be explained.

Figure 2:
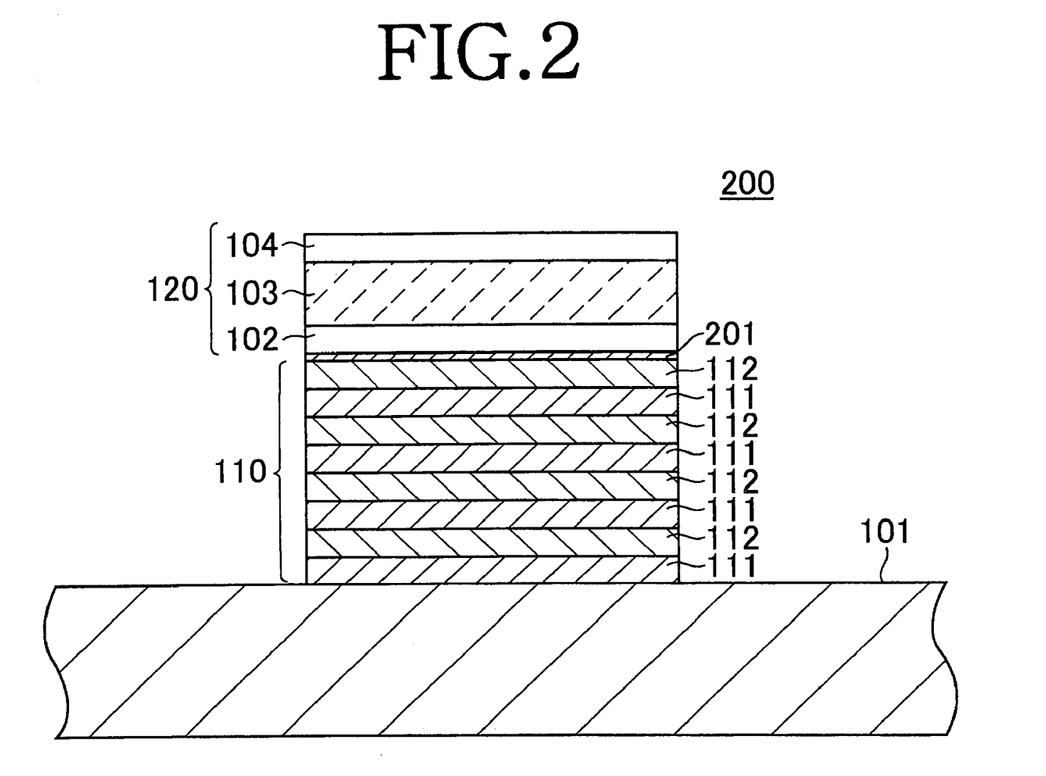
FIG. 2 is a schematic sectional view showing a structure of a film bulk acoustic wave resonator according to another preferred embodiment of the present invention.

FIG. 2 is a schematic sectional view showing a structure of a film bulk acoustic wave resonator according to another preferred embodiment of the present invention.

As shown in FIG. 2, the film bulk acoustic wave resonator 200 includes a high-crystallinity adhesion orientation control film 201 between the acoustic multilayer 110 and the lower electrode 102. Other than this, the film bulk acoustic wave resonator 200 has the same composition as the film bulk acoustic wave resonator 100, so to avoid repetition here, further details thereof are omitted.

The adhesion orientation control film 201 constituting a base for the lower electrode 102 is a film of high crystallinity having a specified crystal plane orientation that serves to enhance the adhesion of the lower electrode 102 and the acoustic multilayer 110 and increase the crystallinity of the lower electrode 102. The adhesion orientation control film 201 is preferably constituted of a nitrogen compound of at least one element selected from among Group III elements such as aluminum (Al), gallium (Ga) and indium (In), or an oxide or sulfide of a Group II element such as beryllium (Be) or zinc (Zn) AlN is the most preferable material for the adhesion orientation control film 201 because it is stable in the atmosphere and can be easily formed into a film of high crystallinity by reactive sputtering.

Even when this high-crystallinity adhesion orientation control film 201 is included, at least one of the reflective films of the acoustic multilayer 110 in the film bulk acoustic wave resonator 200 of this embodiment has a specified crystal plane orientation, providing the same effect obtained by the embodiments described in the foregoing. What is referred to in this invention as the "acoustic multilayer" does not include films that do not actually help to reflect bulk waves, such as the adhesion orientation control film used as a base for the lower electrode.

The present invention has thus been shown and described with reference to specific embodiments. However, it should be noted that the present invention is in no way limited to the details of the described arrangements but changes and modifications may be made without departing from the scope of the appended claims.

For example, the acoustic multilayer 110 in each of the foregoing embodiments is constituted as a stack of four pairs of the first and second reflective films 111 and 112, but is not limited to this number of pairs. There may also be included films other than the reflective films 111 and 112 that substantially contribute to the reflection of the bulk waves.

Moreover, in the present invention, the planer shape of the film bulk acoustic wave resonator is not particularly limited, and it may be any shape including a quadrangle such as a square or a rectangle, a triangle, a polygon, an inequilateral polygon, a circle, an ellipse and the like.

WORKING EXAMPLES AND COMPARATIVE EXAMPLES

Here follows a description of working. examples of the present invention, but the present invention is in no way limited to these examples.

Example 1

In Example 1, a number of film bulk acoustic wave resonators having the structure of the film bulk acoustic wave resonator 100 shown in FIG. 1 were fabricated by the following method.

First, a Si (100) substrate 101 composed of mirror-polished Si single crystal and having a thickness of 250 μm and a resistivity of 1000 Ω·cm was prepared and washed. Next, the acoustic multilayer 110 was formed by repeating four cycles of a process in which a first reflective film 111 made of 1.5 μm thick AlN film formed by RF magnetron sputtering and a second reflective film 112 made of an 0.8 μm thick $SiO_2$ film formed by RF magnetron sputtering were alternately overlaid in this order.

The first reflective film 111 was formed by sputtering, using aluminum (Al) as the target and an 80:20 mixture of argon (Ar) and nitrogen ($N_2$) as the sputter gas. The chamber pressure was set at 0.5 Pa and the sputter temperature at 80° C.

The second reflective film 112 was formed by sputtering, using silicon oxide ($SiO_2$) as the target and a 90:10 mixture of argon (Ar) and oxygen ($O_2$) as the sputter gas. The chamber pressure was set at 1.0 Pa and the sputter temperature at 80° C.

A 150 nm thick lower electrode 102 of platinum (Pt) was formed on the acoustic multilayer 110, followed by an 800 nm thick piezoelectric film 103 of ZnO and an upper electrode 104 of aluminum (Al). Sputtering was used to form the lower and upper electrodes 102 and 104, and RF magnetron sputtering was used to form the piezoelectric film 103.

This completed the fabrication of the film bulk acoustic wave resonator of Example 1.

Measurement of the X-ray rocking curve of the aluminum nitride (AlN) first reflective film 111 of the film bulk acoustic wave resonator of Example 1 thus fabricated confirmed a strong peak in the (0001) plane; the rocking curve FWHM was approximately 1.7 degrees. With respect to the second reflective film 112 of silicon oxide ($SiO_2$), no peak was observed in any crystal plane, confirming the substantially amorphous state of the material.

Next, the measuring instrument was connected to the film bulk acoustic wave resonator of Example 1 to measure the actual resonance characteristics. The measurement results are shown in FIG. 3.

Figure 3:
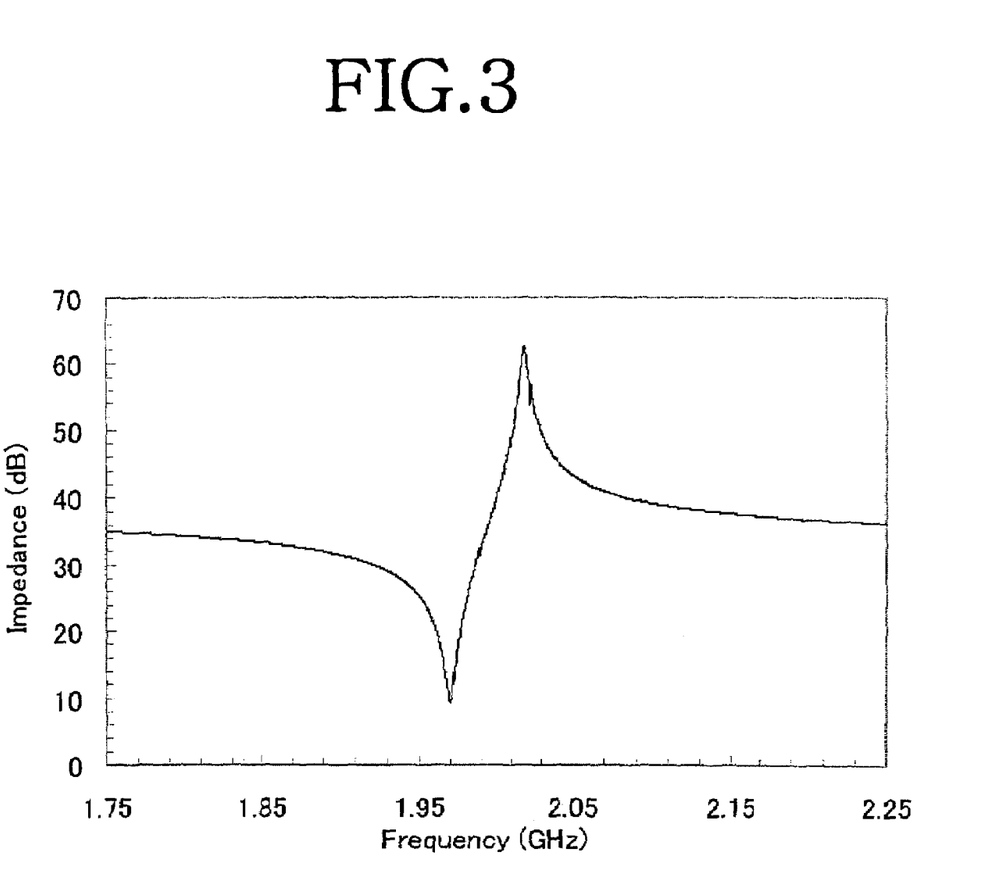
FIG. 3 is a graph showing a resonance characteristics of a film bulk acoustic wave resonator according to the Example 1.

As shown in FIG. 3, in the case of the film bulk acoustic wave resonator of Example 1, there were very few spurious readings caused by substrate reflections, and a good impedance ratio was obtained.

Example 2

The film bulk acoustic wave resonator of Example 2 was formed in the same way as in Example 1, except that the first reflective film 111 was formed using a 50:50 mixture of argon (Ar) and nitrogen ($N_2$).

Measurement of the X-ray rocking curve of the aluminum nitride (AlN) first reflective film 111 of the film bulk acoustic wave resonator of Example 2 thus fabricated confirmed a strong peak in the (0001) plane; the rocking curve FWHM was approximately 10 degrees.

Next, the measuring instrument was connected to the film bulk acoustic wave resonator of Example 2 to measure the actual resonance characteristics. The measurement results are shown in FIG. 4.

Figure 4:
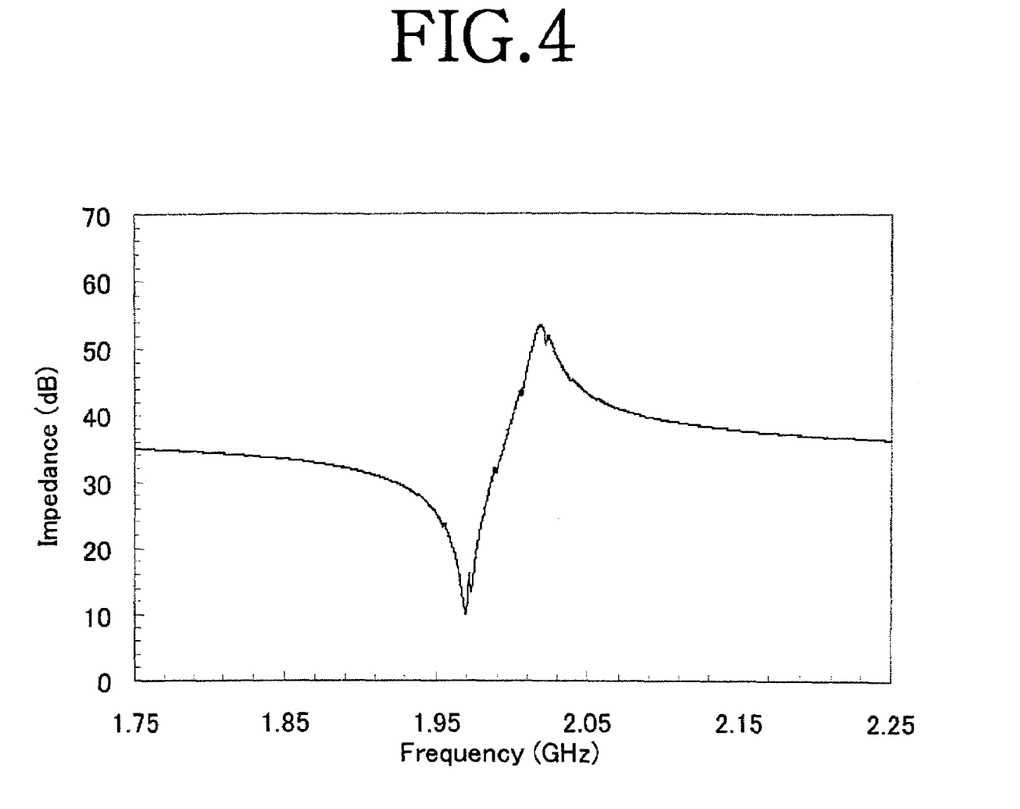
FIG. 4 is a graph showing a resonance characteristics of a film bulk acoustic wave resonator according to the Example 2.

As shown by FIG. 4, there were very few spurious readings caused by reflections from the substrate 101 of the film bulk acoustic wave resonator of Example 2. However, the impedance ratio was lower than in the case of the film bulk acoustic wave resonator of Example 1, which might be due to the different crystallinity of the first reflective film 111.

Comparative Example

The film bulk acoustic wave resonator of Comparative Example was formed in the same way as in Example 1, except that the first reflective film 111 was formed using a 5:95 mixture of argon (Ar) and nitrogen ($N_2$).

When the X-ray rocking curve of the aluminum nitride (AlN) first reflective film 111 of the film bulk acoustic wave resonator of the Comparative Example thus fabricated was measured, no peak was observed in any crystal plane, confirming the substantially amorphous state of the material.

Next, the measuring instrument was connected to the film bulk acoustic wave resonator of Comparative Example to measure the actual resonance characteristics. The measurement results are shown in FIG. 5.

Figure 5:
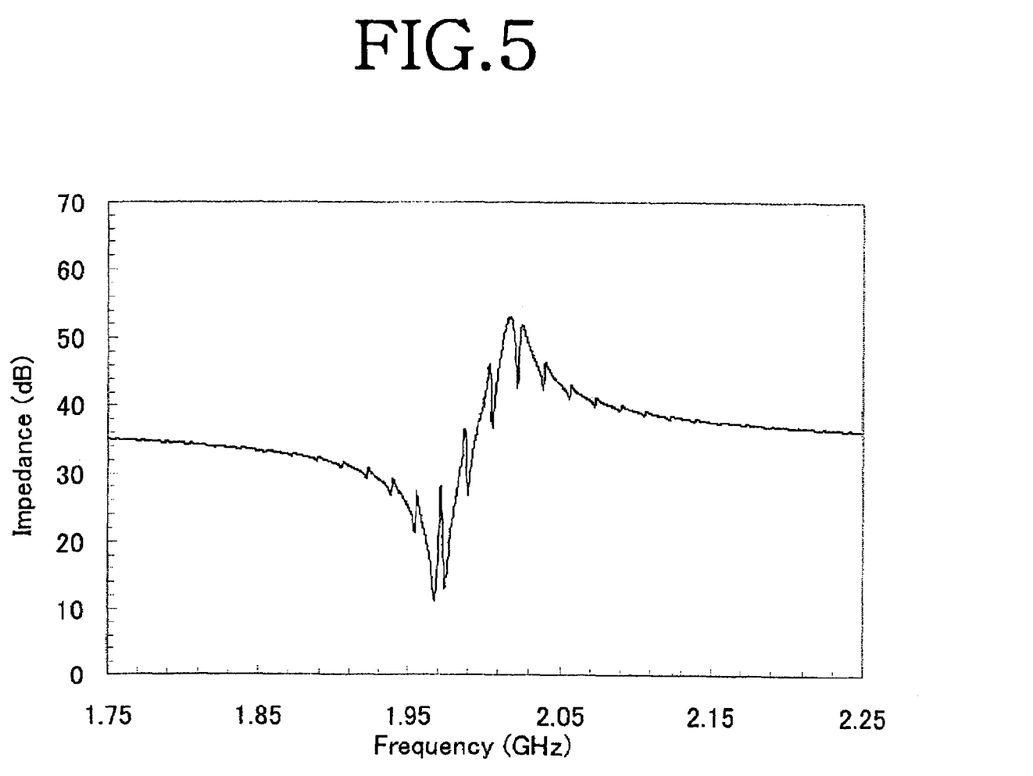
FIG. 5 is a graph showing a resonance characteristics of a film bulk acoustic wave resonator according to the Comparative Example.

As shown by FIG. 5, in the case of the film bulk acoustic wave resonator of the Comparative Example, there was marked spurious readings caused by reflections from the substrate, and the impedance ratio was lower than that of the film bulk acoustic wave resonator of Example 1. This can be considered to be due to the fact that the acoustic multilayer 110 does not include a reflective film having a specified crystal plane orientation.

What is claimed is:

1. A film bulk acoustic wave resonator, comprising:
   a substrate;
   a resonant structure provided on the substrate; and
   an acoustic multilayer including a plurality of reflective films provided between the substrate and the resonant structure,
   in which at least one of the reflective films has a specified crystal plane orientation.

2. The film bulk acoustic wave resonator as claimed in claim 1, wherein an X-ray rocking curve full width at half maximum of said at least one of the reflective films is equal to or less than 10 degrees.

3. The film bulk acoustic wave resonator as claimed in claim 2, wherein said X-ray rocking curve full width at half maximum of said at least one of the reflective films is equal to or less than 3 degrees.

4. The film bulk acoustic wave resonator as claimed in claim 1, wherein said acoustic multilayer includes at least one pair of reflective films including a first reflective film and a second reflective film composed of a different material to that of the first reflective film.

5. The film bulk acoustic wave resonator as claimed in claim 4, wherein said acoustic multilayer includes a plurality of pairs of the first and second reflective films in which an X-ray rocking curve full width at half maximum of at least one of the first and second reflective films of each pair is equal to or less than 10 degrees.

6. The film bulk acoustic wave resonator as claimed in claim 5, wherein said X-ray rocking curve full width at half maximum of at least one of the first and second reflective films of each pair is equal to or less than 3 degrees.

7. The film bulk acoustic wave resonator as claimed in claim 1, wherein said reflective film having the specified crystal plane orientation has a cubic crystal structure, and the specified crystal plane is a (0001) plane.

8. The film bulk acoustic wave resonator as claimed in claim 7, wherein a material of the reflective film having the cubic crystal structure is one of aluminum nitride (AlN), zinc oxide (ZnO) and aluminum oxide ($Al_2O_3$).

9. The film bulk acoustic wave resonator as claimed in claim 1, wherein said reflective film having the specified crystal plane orientation has a face-centered cubic crystal structure, and the specified crystal plane is a (110) plane.

10. The film bulk acoustic wave resonator as claimed in claim 9, wherein a material of the reflective film having the face-centered cubic crystal structure is one of tungsten (W) and molybdenum (Mo).

11. The film bulk acoustic wave resonator as claimed in claim 1, wherein said resonant structure includes a lower electrode, an upper electrode and a piezoelectric film provided between the lower and upper electrodes.

12. The film bulk acoustic wave resonator as claimed in claim 11, further comprising an adhesion orientation control film provided between the acoustic multilayer and the lower electrode.

\* \* \* \* \*